(12) United States Patent
Flegel

(10) Patent No.: US 9,450,390 B1
(45) Date of Patent: Sep. 20, 2016

(54) ELECTRICAL BOX COVER

(71) Applicant: Reliance Controls Corporation, Racine, WI (US)

(72) Inventor: David D. Flegel, Wind Point, WI (US)

(73) Assignee: Reliance Controls Corporation, Racine, WI (US)

( * ) Notice: Subject to any disclaimer, the term of this patent is extended or adjusted under 35 U.S.C. 154(b) by 0 days.

(21) Appl. No.: 14/753,647

(22) Filed: Jun. 29, 2015

(51) Int. Cl.
| H02G 3/08 | (2006.01) |
| H02G 3/14 | (2006.01) |
| H05K 5/02 | (2006.01) |

(52) U.S. Cl.
CPC ............... *H02G 3/081* (2013.01); *H02G 3/14* (2013.01); *H05K 5/0226* (2013.01)

(58) Field of Classification Search
CPC ....... H02G 3/081; H02G 3/14; H05K 5/0226
USPC ....... 220/241, 242, 3.2, 3.3, 3.8; 174/66, 67; 33/528; 439/135
See application file for complete search history.

(56) References Cited

U.S. PATENT DOCUMENTS

| 932,601 | A | * | 8/1909 | Corbett ................... E05D 15/00 |
| | | | | 16/268 |
| 3,432,611 | A | * | 3/1969 | Gaines .................... H02G 3/121 |
| | | | | 174/66 |
| 5,763,831 | A | | 6/1998 | Shotey et al. |
| 5,944,209 | A | | 8/1999 | Daoud |
| 6,476,321 | B1 | | 11/2002 | Shotey et al. |
| 6,700,063 | B2 | | 3/2004 | Shotey et al. |
| 6,806,426 | B1 | | 10/2004 | Gretz |
| 6,894,223 | B1 | | 5/2005 | Shotey et al. |
| 6,921,861 | B1 | | 7/2005 | Gretz |
| 6,979,777 | B2 | | 12/2005 | Marcou et al. |
| 7,071,415 | B1 | | 7/2006 | Shotey et al. |
| 7,462,777 | B2 | | 12/2008 | Dinh |
| 7,619,162 | B2 | | 11/2009 | Dinh et al. |
| 7,763,799 | B2 | | 7/2010 | Johnson |
| 8,153,895 | B2 | | 4/2012 | Drane |
| 8,899,432 | B2 | * | 12/2014 | Jolly ......................... H02G 3/14 |
| | | | | 220/3.8 |
| 2010/0181091 | A1 | * | 7/2010 | Drane ....................... H02G 3/14 |
| | | | | 174/66 |

* cited by examiner

*Primary Examiner* — Robert J Hicks
*Assistant Examiner* — Kareen Thomas
(74) *Attorney, Agent, or Firm* — Boyle Fredrickson, S.C..

(57) ABSTRACT

An electrical box cover including a body for securing a plurality of electrical connections therein, a cover having a door, the door having a first end with at least one male hinge, at least one female hinge attached to the cover, and wherein the at least one male hinge is removably connected with the at least one female hinge to selectively open and close the door.

17 Claims, 7 Drawing Sheets

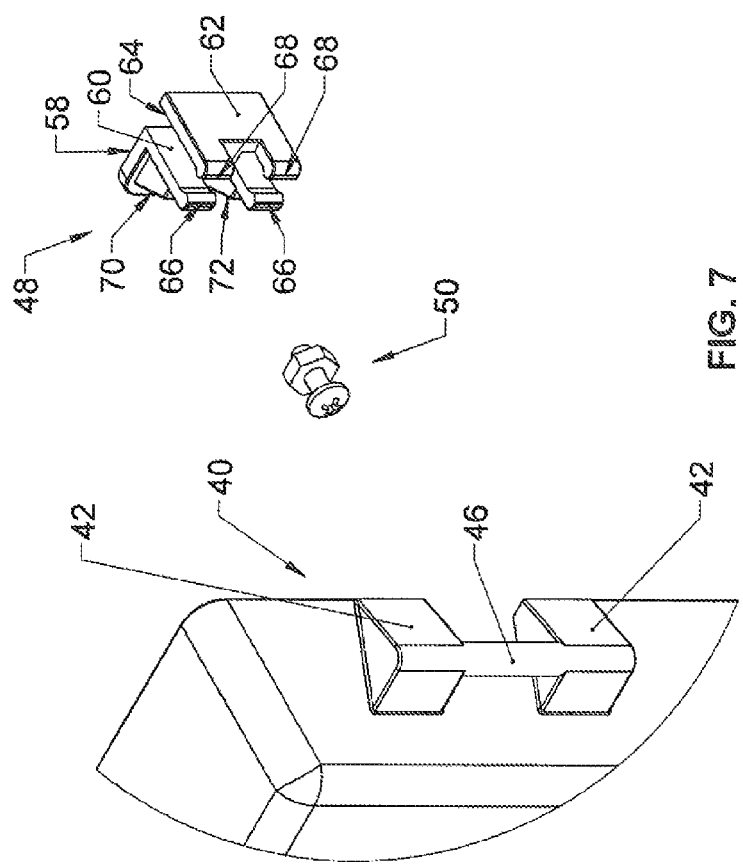
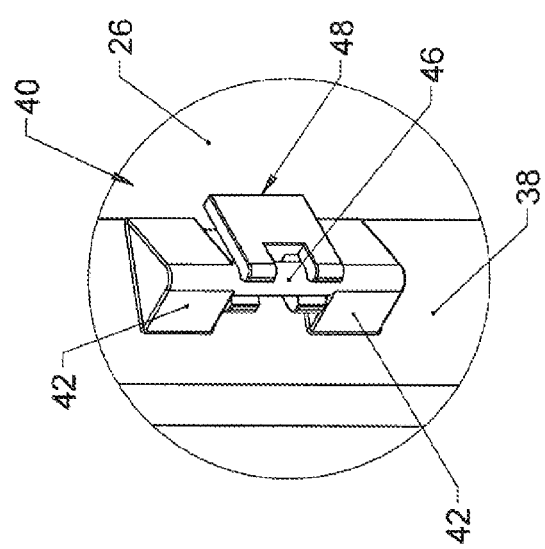

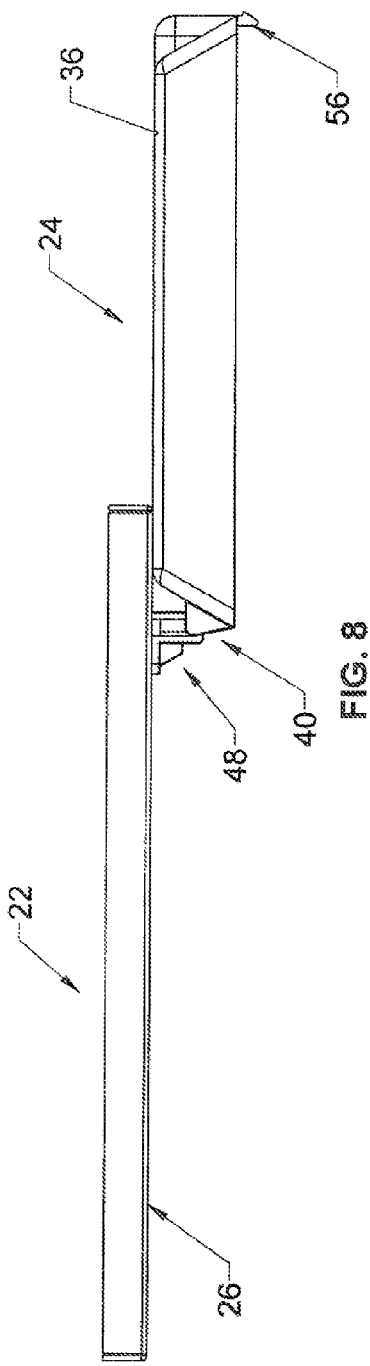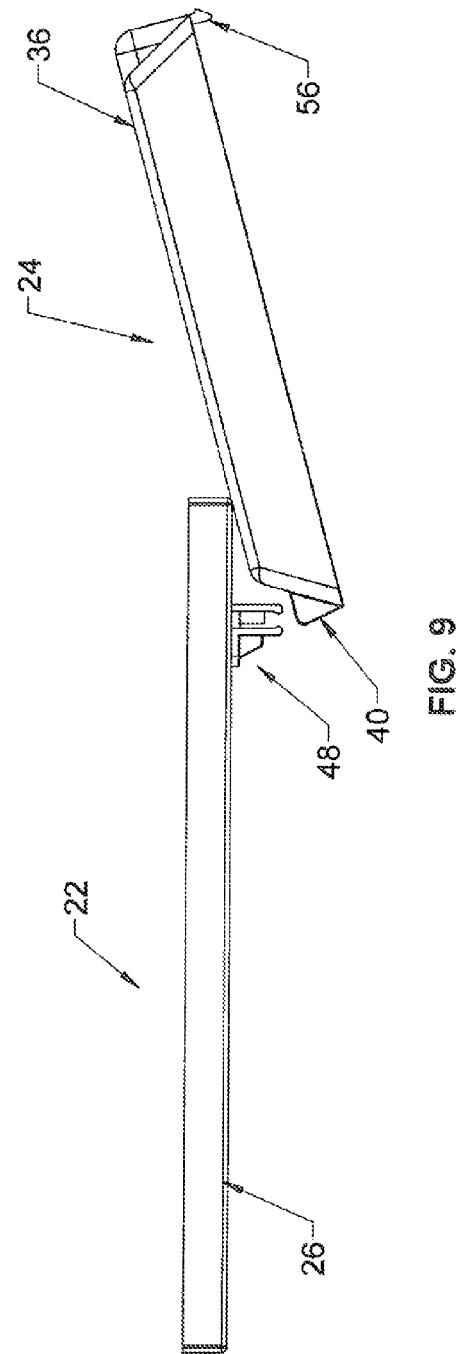

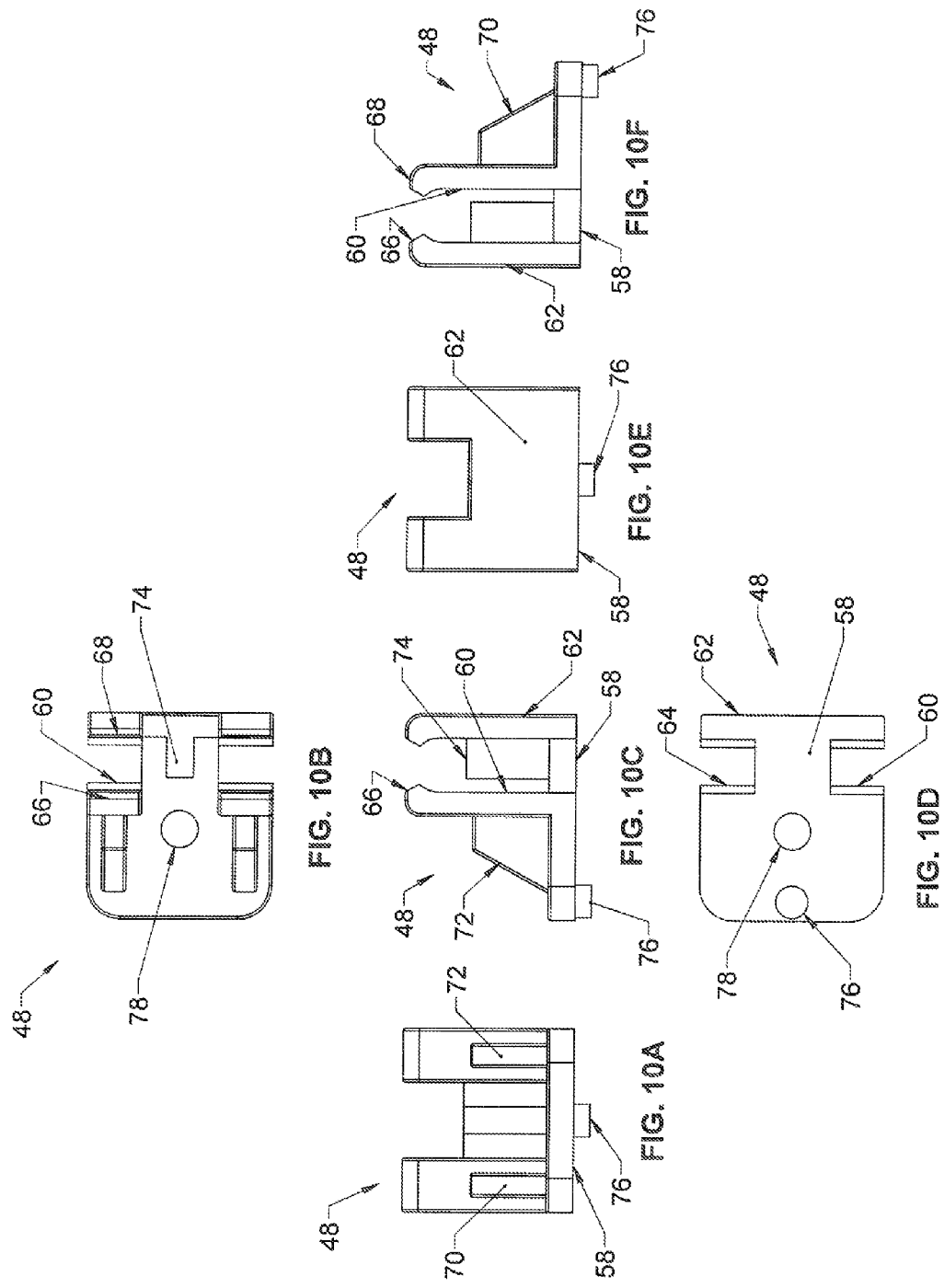

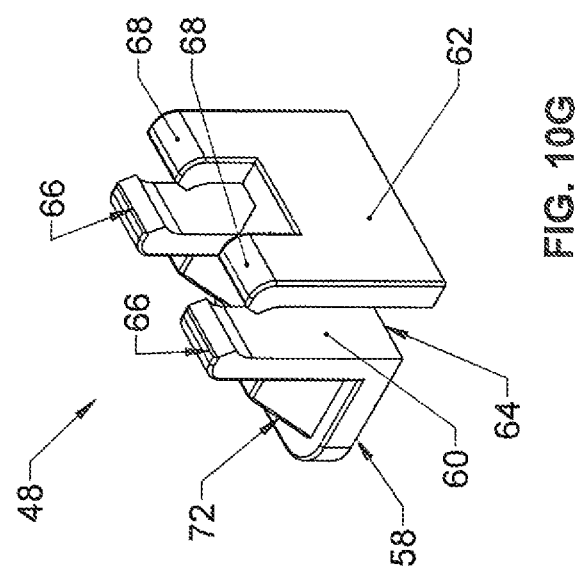

ELECTRICAL BOX COVER

BACKGROUND

1. Technical Field

Aspects of this document relate generally to electrical boxes and more particularly to electrical box covers.

2. Background Art

Electrical boxes are used in both commercial and residential applications with various sizes and configurations utilized depending on the electrical panel design and other various requirements. Electrical panel designs also utilize a number of traditional hinge designs whereby the cover door rotates about hinge pins or other suitable devices to move from an open position to a closed position. These electrical box covers and doors are used to protect components and circuitry housed within the electrical box, prevent contact with current-carrying parts, and still permit access to certain isolated components such as electrical circuit breaker handles. This arrangement allows safe access to those product components necessary to be operated in normal use or service.

SUMMARY

Aspects of this document relate to an electrical box cover including a body for securing a plurality of electrical connections therein, a cover having a door, the door having a first end with at least one male hinge, at least one female hinge attached to the cover, and wherein the at least one male hinge is removably connected with the at least one female hinge to selectively open and close the door.

In an implementation, the at least one male hinge may be a plurality of male hinges and wherein the at least one female hinge is a plurality of female hinges. The at least one male hinge may be offset from the door first end. The door may be pivotable from a closed position to an open position and to a removed position. The door may be disconnected from the cover when the door front surface reaches a predetermined first position while an opening force is continuously applied until the at least one male hinge and the at least one female hinge are separated. The at least one female hinge and the at least one male hinge are reconnectable.

The disconnection and reconnection of the at least one female hinge and the at least one male hinge does not break either of the at least one female hinge and the at least one male hinge. The door may further include a tab and the cover may further include an engagement aperture. The tab may fit within the engagement aperture when the cover is in the closed position. The at least one male hinge may further include a mounting rod positioned between two pillars. The at least one female hinge may include a pair of mounting arms adapted to receive the mounting rod. The at least one female hinge may be generally U-shaped.

The at least one female hinge may further include a plurality of retaining projections on a top surface of the at least one female hinge. The at least one female hinge may further include a pair of mounting arms with each mounting arm having a retaining projection. The retaining projections may be angled inwards to reduce the size of an opening formed by the pair of mounting arms. The retaining projections are not damaged when the door is connected or disconnected. The door may be rotatable in a direction of 90 degrees or 180 degrees with respect to the cover and may be mounted to the cover such that the door pivots open in any direction.

In another aspect, a method of installing an electrical box includes the steps of securing a front cover on the installed electrical box, securing at least one female hinge having a pair of mounting arms to the front cover at a selected location on the front cover to determine an opening direction, orienting a door having at least one male hinge, inserting the at least one male hinge into the at least one female hinge, and pivoting the door to a closed position to close the electrical box.

In an implementation, the method may include the step of pivoting the door to an open position, pivoting the door further until a front surface of the door contacts the front cover, and continuing to apply pressure until the at least one male hinge is withdrawn from the at least one female hinge. The method may include the step of repositioning the at least one male hinge within the at least one female hinge and pivoting the cover to the closed position.

Aspects and applications of the disclosure presented here are described below in the drawings and detailed description. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventor's intent and desire that the simple, plain and ordinary meaning of the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Embodiments of the present disclosure will hereinafter be described in conjunction with the appended drawings, where like designations denote like elements, and:

FIG. 6 is an enlarged view of the at least one male hinge and the at least one female hinge engaged.

FIG. 7 is an enlarged exploded view of the at least one male hinge and the at least one female hinge separated.

FIG. 8 is a top view of the electrical box cover with the door in an open position.

FIG. 9 is a top view of the electrical box cover with the door rotated beyond the open position and disconnecting the door from the cover.

FIG. 10A is an endwise view of the at least one female hinge.

FIG. 10B is a top view of the at least one female hinge.

FIG. 10C is a front view of the at least one female hinge.

FIG. 10D is a bottom view of the at least one female hinge.

FIG. 10E is an endwise view of the at least one female hinge.

FIG. 10F is a back view of the at least one female hinge.

FIG. 10G is a perspective view of the at least one female hinge.

DESCRIPTION

This disclosure, its aspects and implementations, are not limited to the specific components or assembly procedures disclosed herein. Many additional components and assembly procedures known in the art consistent with the intended operation and assembly procedures for an electrical box cover will become apparent for use with implementations of an electrical box cover from this disclosure. Accordingly, for example, although particular components are disclosed, such components and other implementing components may comprise any shape, size, style, type, model, version, measurement, concentration, material, quantity, and/or the like as is known in the art for such implementing components, consistent with the intended operation of an electrical box cover.

Figure 1:
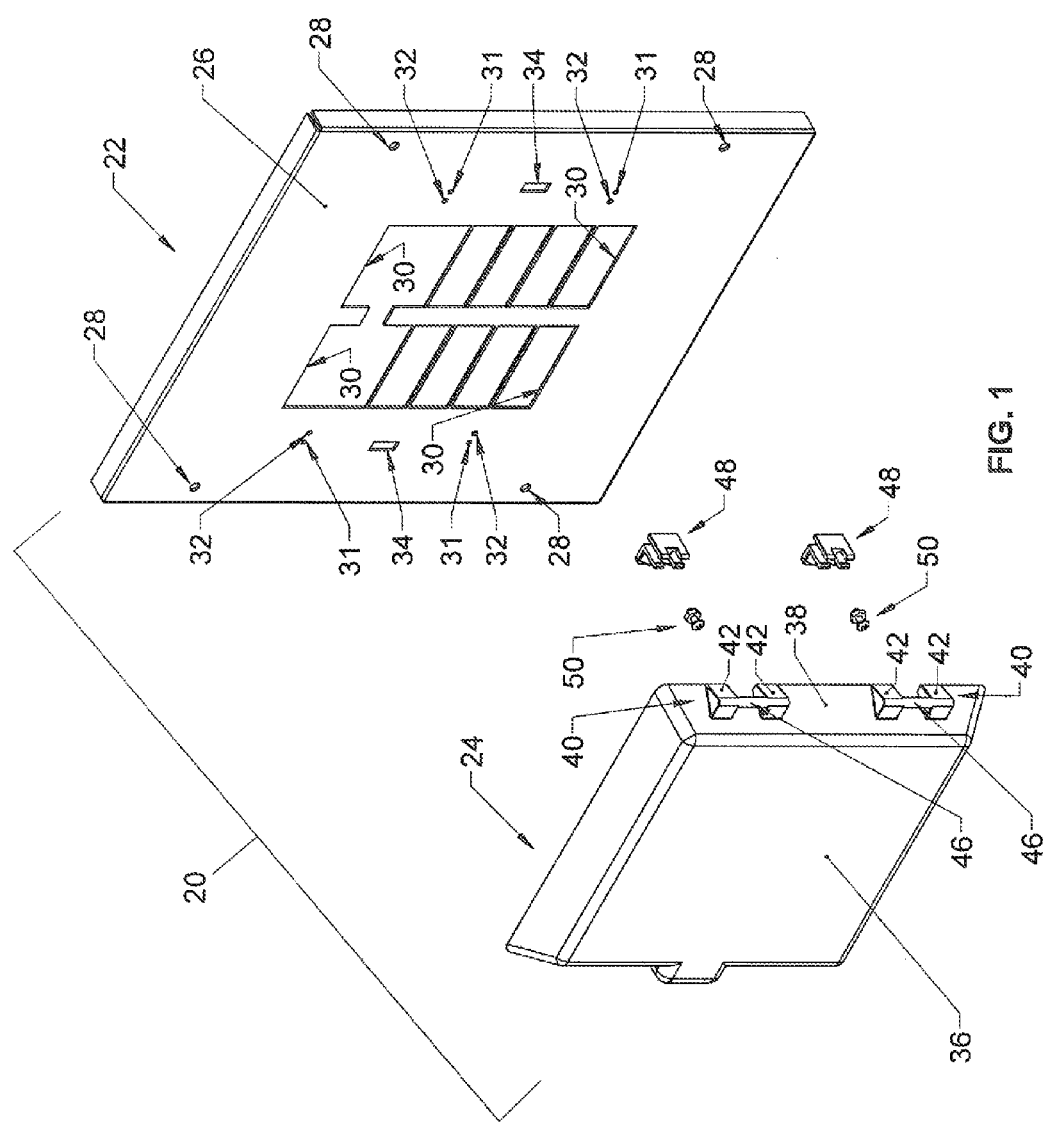
FIG. 1 is an exploded perspective view of an electrical box cover and a door.
Figure 3:
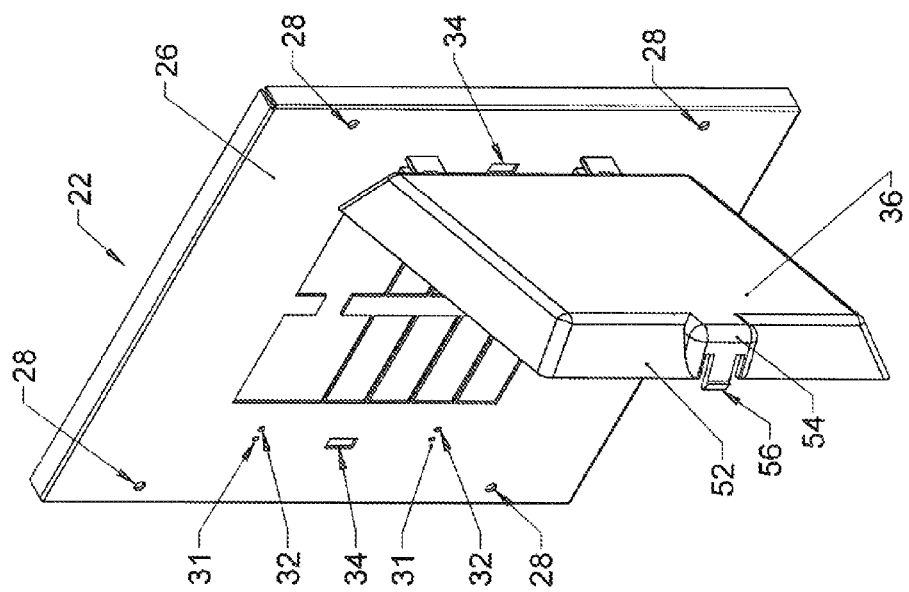
FIG. 3 is a perspective view of the door in an open position on the electrical box cover in the first orientation.
Figure 2:
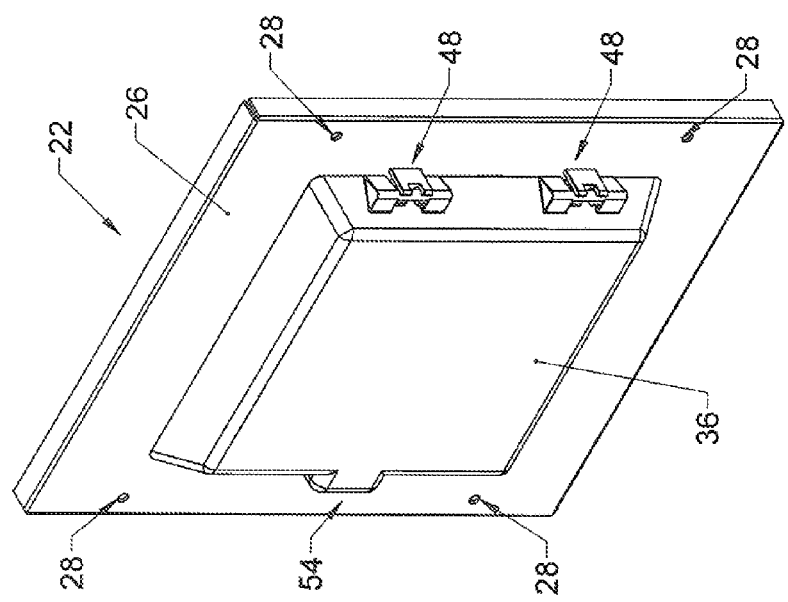
FIG. 2 is a perspective view of the door in a closed position on the electrical box cover in a first orientation.
Figure 5:
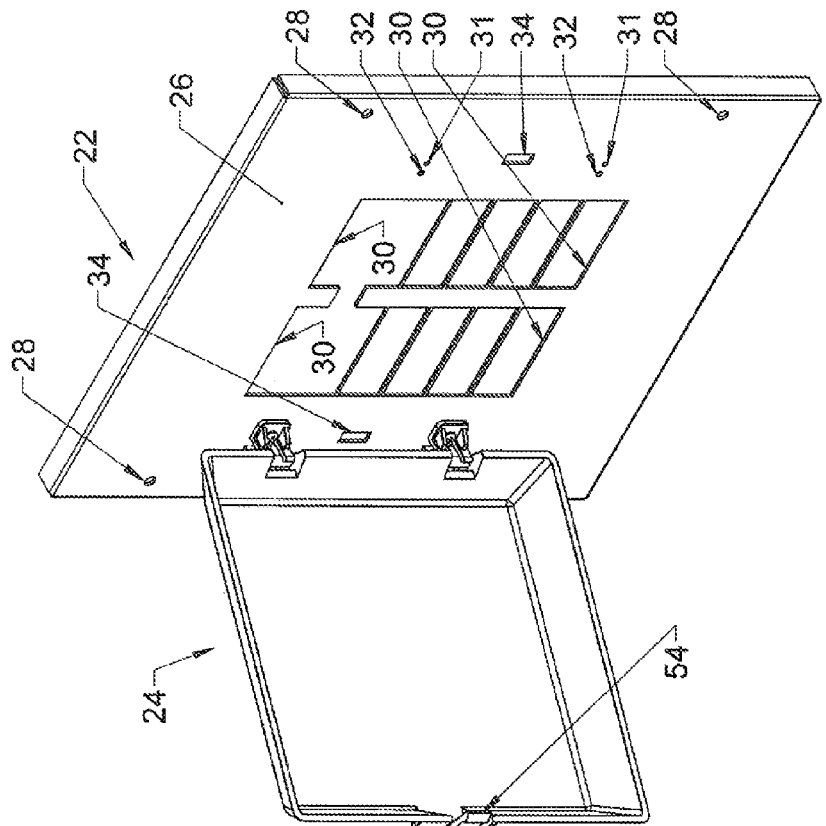
FIG. 5 is a perspective view of the door in an open position on the electrical box in the second orientation.
Figure 4:
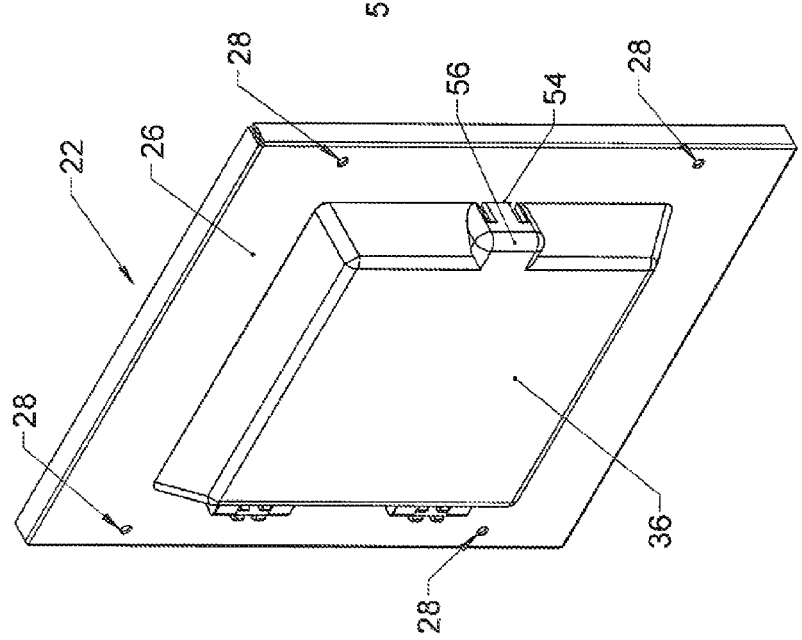
FIG. 4 is a perspective view of the door in a closed position on the electrical box cover in a second orientation.

FIGS. 1-10G illustrate various views of an electrical box cover assembly 20 having a cover 22 with a door 24 which may be pivotable and removable. While not shown, electrical box cover 22 is mounted to a body which has a plurality of electrical breakers or electrical components therein as is known in the art. Electrical box cover 22 may be secured to the body through apertures 28 on a front surface 26. The electrical box cover 22 may also include a plurality of openings 30 for electrical circuit breakers or other electrical components to protrude through. Further, a plurality of alignment holes 31 and a plurality of mounting holes 32 are positioned on each side of openings 30, while at least one engagement aperture 34 is positioned on each side of openings 30.

Door 24 includes a front wall 36 with an angled side wall 38. A pair of male hinges 40 are positioned on the angled side wall 38 with each male hinge 40 having pillars 42 with a mounting rod 46 connecting pillars 42 at an end. Male hinges 40 may extend away from angled side wall 38 and may be offset from the angled wall. A tab 54 with a latch 56 may be positioned on a side wall 52 of door 24. In one implementation, angled side wall 38 is positioned opposite side wall 52 on parallel walls.

A plurality of female hinges 48 are connected to cover 22 at alignment holes 31 and mounting holes 32 and particularly with screws 50 extending through aperture 78 in each female hinge 48. Screws 50 may be secured to cover 22 by being threaded directly into mounting holes 32 or by utilizing nuts or other attachment mechanisms known in the art.

Moving to FIGS. 7 and 10A-10G, female hinge 48 is shown in greater detail. Female hinge 48 may be removable and replaceable on any of a number of positions on cover 22 as described above by using screw 50. Female hinge 48 includes a base 58 with mounting arms 60 and 62 extending away from base 58. Mounting arms 60 and 62 may form a generally U-shape in combination with base 58 and the mounting arms define a mounting region 64 there between. Mounting arms 60 terminate with retaining projections 66 at least partially forming a top surface of the female hinge. Similarly, mounting arms 62 terminate with retaining projections 68 at least partially forming a top surface of the female hinge. Each of the retaining projections 66, 68 may extend inward into mounting region 64 such that the mounting region 64 between the retaining projections 66, 68 is narrower than between mounting arms 60, 62 close to base 58. Accordingly, this structure provides additional strength to help retain mounting rod 46 within the mounting region 64. The mounting arms 60, 62 and retaining projections 66, 68 may be flexible enough to permit mounting rod 46 to expand away from each other and allow the mounting rod to be position within mounting region 64 and resilient enough to return to their normal position without much deflection to assist with retaining the mounting rod 46 therein. It should be noted that if too much pressure or force is imparted on the mounting arms then they could be damaged and unusable. In another aspect, the retaining projections 66, 68 are angled inwards and may include ribs or ridges to further strengthen the top surface of the mounting arms 60, 62.

Each female hinge 48 includes ledges 70 and 72 on an inward surface and are oriented to provide additional strength and stability for each female hinge. In one implementation, door 22 may have recessed regions adjacent each male hinge 40 and these recessed regions can be positioned near ledges 70 and 72 to ensure that moisture, dirt, dust, or other contamination within the electrical box is reduced. Each female hinge may also include a mounting rod ledge 74 positioned between mounting arms 60, 62 and used to limit the lowest position mounting rod 46 may sit within mounting region 64. Further, mounting rod ledge 74 may function as a bridge and stability point to connect the mounting arms 60, 62. Aperture 78 may be positioned near prong 76, with aperture 78 arranged to receive screw 50 as previously described. Prong 76 is utilized to fit within alignment holes 31. Prong 76 may be used to help with easier installation, removal, or replacement of female hinges 48 by orienting the hinge in combination with aperture 78. Specifically, female hinges 48 may be efficiently positioned within alignment holes 31 to at least partially retain the female hinges 48 while screws 50 are positioned through aperture 78 and mounting holes 32.

Installation of female hinges 48 determines the orientation and operation of door 24, specifically in which direction door 24 opens. When female hinges 48 are positioned on the right side of cover 22, door 24 opens from the left side and pivots towards the right side. When female hinges 48 are positioned on the left side of cover 22, door 24 opens from the right side and pivots towards the left side. While not shown, it is within the spirit and scope of the present disclosure to position door 24 so that it opens upwards or downwards by locating appropriate mounting holes 32 and alignment holes 31 at the top or bottom of cover 22 as one of skill in the art will immediately appreciate.

Installation of cover 22 and door 24 may be accomplished with the following steps, including securing cover 22 to an electrical box through apertures 28 such that electrical breakers and electrical components are positioned and accessible through openings 30. Female hinges 48 are selectively positioned on front surface 26 on either the left side, right side, top side, or bottom side of openings 30. Female hinges 48 are secured to cover 22 through alignment holes 31 and mounting holes 32. In one implementation, female hinges 48 may be secured to cover 22 prior to installation of cover 22 or after installation of cover 22.

Door 24 is removably positioned on female hinges 48 by inserting mounting rods 46 through retaining projections 66, 68 and into mounting region 64. At this point, door 24 can rotate or pivot to a fully closed position where tab 54 and latch 56 are positioned within engagement aperture 34. Door 24 may be disconnected from cover 22 by simply pulling door 24 and particularly male hinge 40 away from cover 22 so that mounting rods 46 are pulled through the resistance created by retaining projections 66, 68 so that door 24 is disconnected from cover 22 and female hinges 48. Conveniently, male hinge 40 can easily be reinstalled because the removal of the door 24 from female hinge 48 does not damage either male hinge 40 or female hinge 48.

In operation, the door functions normally to open and close. In one implementation, the door opens normally until front surface 26 contacts cover 22 or other nearby walls when the door is fully opened. The door may be pushed further along side wall 52 which may create a force which can disengage male hinge 40 from female hinge 48. In prior art implementations, doors which are opened too far are damaged or destroy the hinges, doors, or cover. In a current implementation, door 24 is shown in the open position in FIG. 8, and is shown in the disconnected position in FIG. 9. As can be seen in FIG. 9, the additional force applied to door 24 can be imparted due to the contact of front surface 26 with cover 22 imparting a removal force between male hinges 40 and female hinges 48. Advantageously, the features of female hinge 48 are structured so that the cover can easily and effectively be installed, removed, or dislodged without damaging the components of the door or cover while still allowing flexibility to install the door in multiple orientations or before or after installation of the cover.

The installation method may include securing cover 22 to the electrical box, then securing female hinges 48 to cover 22 so that the door 24 opens in a desired direction, orienting the door with the male hinge 40, and inserting male hinge 40 into female hinge 48. Next, door 24 is pivoted to a closed position. The door 24 may be pivoted to an open position and the door may be further pivoted until front surface 26 contacts cover 22 and additional pressure is applied until male hinge 40 is withdrawn from female hinge 48. Next, the door 24 may be repositioned with the male hinge 40 reinserted into female hinge 48 and finally pivoting door 24 to the closed position. Alternatively, door 24 may be installed by inserting tab 54 into aperture 34 while resting mounting rods 46 at the opening formed between retaining projections 66, 68 and then pressing door 24 towards cover 22 until mounting rods 46 snap into place.

It will be understood that implementations are not limited to the specific components disclosed herein, as virtually any components consistent with the intended operation of a method and/or system implementation for an electrical box cover may be utilized. Components may comprise any shape, size, style, type, model, version, class, grade, measurement, concentration, material, weight, quantity, and/or the like consistent with the intended operation of a method and/or system implementation for an electrical box cover.

The concepts disclosed herein are not limited to the specific implementations shown herein. For example, it is specifically contemplated that the components included in a particular implementation of an electrical box cover may be formed of any of many different types of materials or combinations that can readily be formed into shaped objects and that are consistent with the intended operation of an electrical box cover. For example, the components may be formed of: rubbers (synthetic and/or natural) and/or other like materials; polymers and/or other like materials; plastics, and/or other like materials; composites and/or other like materials; metals and/or other like materials; alloys and/or other like materials; and/or any combination of the foregoing.

Furthermore, embodiments of the electrical box cover may be manufactured separately and then assembled together, or any or all of the components may be manufactured simultaneously and integrally joined with one another. Manufacture of these components separately or simultaneously may involve extrusion, pultrusion, vacuum forming, injection molding, blow molding, resin transfer molding, casting, forging, cold rolling, milling, drilling, reaming, turning, grinding, stamping, cutting, bending, welding, soldering, hardening, riveting, punching, plating, and/or the like. If any of the components are manufactured separately, they may then be coupled or removably coupled with one another in any manner, such as with adhesive, a weld, a fastener, any combination thereof, and/or the like for example, depending on, among other considerations, the particular material(s) forming the components.

In places where the description above refers to particular implementations of an electrical box cover, it should be readily apparent that a number of modifications may be made without departing from the spirit thereof and that these implementations may be applied to other electrical box covers. The accompanying claims are intended to cover such modifications as would fall within the true spirit and scope of the disclosure set forth in this document. The presently disclosed implementations are, therefore, to be considered in all respects as illustrative and not restrictive, the scope of the disclosure being indicated by the appended claims rather than the foregoing description. All changes that come within the meaning of and range of equivalency of the claims are intended to be embraced therein.

I claim:

1. An electrical box assembly comprising:
   a body for receiving a plurality of electrical components and/or connections within an interior;
   a cover having a door, wherein the cover is configured for engagement with the body and to overlie the interior of the body;
   the door having a first end with at least one male hinge;
   at least one female hinge, wherein the at least one female hinge and the cover include removable attachment structures that enable the at least one female hinge to be attached to the cover in either a first configuration or a second configuration; wherein the at least one male hinge is removably connected with the at least one female hinge to selectively enable the door to be moved between an open position and a closed position, wherein the cover is movable in a first direction between the open and closed positions when the at least one female hinge is attached to the cover in the first configuration and is movable in a second direction between the open and closed positions when the at least one female hinge is attached to the cover in the second configuration; and
   a latch arrangement associated with the cover and the door, wherein the latch arrangement comprises a latch member carried by the door and first and second engagement structures on the cover, wherein the first engagement structure on the cover is configured to cooperate with the latch member for securing the door in the closed position when the door is movable between the open and closed positions in the first direction, and wherein the second engagement structure on the cover is configured to cooperate with the latch member for securing the door in the closed position when the door is movable between the open and closed positions in the second direction.

2. The electrical box assembly of claim 1 wherein the at least one male hinge is a plurality of male hinges and wherein the at least one female hinge is a plurality of female hinges.

3. The electrical box assembly of claim 1 wherein the at least one male hinge is offset from the door first end.

4. The electrical box assembly of claim 1 wherein the door is pivotable from the closed position to the open position and is further movable to a removed position in which the at least one male hinge and the at least one female hinge are disengaged from each other.

5. The electrical box assembly of claim 1 wherein the latch member on the door comprises a tab and the first and second engagement structures on the cover comprise first and second engagement apertures, wherein the tab is engaged with the first engagement aperture for maintaining the door in the closed position when the door is movable between the open and closed positions in the first direction, and wherein the tab is engaged with the second engagement aperture for maintaining the door in the closed position when the door is movable between the open and closed positions in the second direction.

6. The electrical box assembly of claim 5 wherein the tab fits within each engagement aperture when the door is in the closed position.

7. The electrical box assembly of claim 1 wherein the first and second directions of movement of the door are separated from each other by 180 degrees.

8. An electrical box assembly comprising:
a body for receiving a plurality of electrical components and/or connections within an interior;
a cover having a door, wherein the cover is configured for engagement with the body and to overlie the interior of the body;
the door having a first end with at least one male hinge;
at least one female hinge attached to the cover;
wherein the at least one male hinge is removably connected with the at least one female hinge to selectively enable movement of the door between an open position and a closed position, and wherein the at least one male hinge is connected to the at least one female hinge by application of an inward force on the door that engages the at least one male hinge with the at least one female hinge; and
wherein the door and the cover include contact surfaces that come into contact with each other at a location spaced from the male and female hinges when the door is moved past the open position to a door disconnection position, wherein the door is disconnected from the cover when the contact surfaces of the door and the cover are in contact with each other and an opening force is continuously applied to the door, wherein application of the opening force to the door creates an outward force on the at least one male hinge to cause the at least one male hinge and the at least one female hinge to become separated.

9. The electrical box assembly of claim 8 wherein the at least one female hinge and the at least one male hinge are reconnectable by application of the inward force on the cover that engages the at least one male hinge with the at least one female hinge.

10. The electrical box assembly of claim 8 wherein the disconnection and reconnection of the at least one female hinge and the at least one male hinge does not break either of the at least one female hinge and the at least one male hinge.

11. The electrical box assembly of claim 8 wherein the at least one male hinge further comprises a mounting rod positioned between two pillars.

12. The electrical box assembly of claim 11 wherein the at least one female hinge comprises a pair of mounting arms adapted to receive the mounting rod.

13. The electrical box assembly of claim 12 wherein the at least one female hinge is generally U-shaped.

14. The electrical box assembly of claim 13 wherein the at least one female hinge further comprises a plurality of retaining projections on a top surface of the at least one female hinge.

15. An electrical box assembly comprising:
a body for securing a plurality of electrical components and/or connections therein;
a cover having a door;
the door having a first end with at least one male hinge;
at least one female hinge attached to the cover; and,
wherein the at least one male hinge is removably connected with the at least one female hinge to selectively open and close the door, and wherein the at least one female hinge further comprises a pair of mounting arms with each mounting arm having a retaining projection.

16. The electrical box assembly of claim 15 wherein the retaining projections are angled inwards to reduce the size of an opening formed by the pair of mounting arms.

17. The electrical box assembly of claim 16 wherein the retaining projections are not damaged when the door is connected or disconnected.

* * * * *